US012372300B2

(12) United States Patent
Uihlein et al.

(10) Patent No.: US 12,372,300 B2
(45) Date of Patent: Jul. 29, 2025

(54) DRYING DEVICE AND METHOD FOR DRYING A SUBSTRATE

(71) Applicant: RENA TECHNOLOGIES GMBH, Guetenbach (DE)

(72) Inventors: Markus Uihlein, Guetenbach (DE); Stefan Hansen, Guetenbach (DE); Tobias Rosshart, Guetenbach (DE)

(73) Assignee: RENA Technologies GmbH, Guetenbach (DE)

( * ) Notice: Subject to any disclaimer, the term of this patent is extended or adjusted under 35 U.S.C. 154(b) by 135 days.

(21) Appl. No.: 18/326,065

(22) Filed: May 31, 2023

(65) Prior Publication Data
US 2023/0314072 A1    Oct. 5, 2023

Related U.S. Application Data

(62) Division of application No. 16/629,049, filed as application No. PCT/DE2018/100641 on Jul. 12, 2018, now abandoned.

(30) Foreign Application Priority Data
Jul. 14, 2017 (DE) .................. 10 2017 115 875.8

(51) Int. Cl.
*F26B 15/14* (2006.01)
*F26B 21/00* (2006.01)
(Continued)

(52) U.S. Cl.
CPC .......... *F26B 15/14* (2013.01); *F26B 21/004* (2013.01); *H01L 21/67034* (2013.01); *F26B 2015/003* (2013.01)

(58) Field of Classification Search
CPC .. F26B 15/14; F26B 21/004; F26B 2015/003; H01L 21/67034
See application file for complete search history.

(56) References Cited

U.S. PATENT DOCUMENTS 4,060,914 A * 12/1977 Hoffman ............... F26B 21/004
                                                        454/306
5,265,383 A * 11/1993 Shank, Jr. ............... B24C 11/00
                                                        451/90
(Continued)

FOREIGN PATENT DOCUMENTS

CN           1455948 A      11/2003
CN         104838221 A       8/2015
(Continued)

*Primary Examiner* — Edelmira Bosques
*Assistant Examiner* — Bao D Nguyen
(74) *Attorney, Agent, or Firm* — Laurence A. Greenberg; Werner H. Stemer; Ralph E. Locher

(57) ABSTRACT

A drying device contains an upper drying head and a lower drying head. The upper drying head is arranged above a transport plane, in which objects to be dried can be transported in a transport direction through the drying device. The lower drying head is arranged below the transport plane. The upper drying head and the lower drying head contain in each case at least one air outlet slot and the longitudinal directions of the air outlet slots essentially extending parallel to the transport plane and transversely to the transport direction, and in which slot planes, in which the air outlet slots extend, intersect the transport plane at angles which are greater than 0° and less than 90°.

10 Claims, 7 Drawing Sheets

(51) Int. Cl.
*H01L 21/67* (2006.01)
*F26B 15/00* (2006.01)

(56) References Cited

U.S. PATENT DOCUMENTS

| | | | |
|---|---|---|---|
| 5,940,985 A | 8/1999 | Kamikawa et al. | |
| 6,440,215 B1 * | 8/2002 | Lymn | B23K 1/206 |
| | | | 118/62 |
| 6,528,425 B1 * | 3/2003 | Uraguchi | H01L 21/67034 |
| | | | 438/689 |
| 10,941,983 B2 | 3/2021 | Mongrolle et al. | |
| 2012/0061345 A1 | 3/2012 | Utsumi | H01L 1/67034 |
| | | | 216/13 |

FOREIGN PATENT DOCUMENTS

| | | |
|---|---|---|
| EP | 1054457 A2 | 11/2000 |
| JP | S61111542 A | 5/1986 |
| JP | 04056371 U | 5/1992 |
| JP | H0714819 A * | 1/1995 |
| JP | H07014819 A | 1/1995 |
| JP | H08338686 A | 12/1996 |
| JP | H09120951 A | 6/1997 |
| JP | H10180205 A | 7/1998 |
| JP | H11111666 A | 4/1999 |
| JP | H11204489 | 7/1999 |
| JP | H11204489 A * | 7/1999 |
| JP | 2000146443 A | 5/2000 |
| JP | 2003031546 A | 1/2003 |
| JP | 2003133217 A | 5/2003 |
| JP | 2006198581 A | 8/2006 |
| JP | 2015198254 A | 9/2015 |
| JP | 2015213860 | 12/2015 |
| JP | 2017154111 A | 9/2017 |
| TW | 326548 B | 2/1998 |
| TW | I283441 B | 7/2007 |
| WO | 02073672 A1 | 9/2002 |
| WO | 2005048336 A1 | 5/2005 |

\* cited by examiner

DRYING DEVICE AND METHOD FOR DRYING A SUBSTRATE

CROSS-REFERENCE TO RELATED APPLICATION

This application is a divisional of patent application Ser. No. 16/629,049, filed Jan. 7, 2020; which was a § 371 national stage filing of international application No. PCT/DE2018/100641, filed Jul. 12, 2018, which designated the United States; this application also claims the priority, under 35 U.S.C. § 119, of German patent application No. DE 10 2017 115 875.8, filed Jul. 14, 2017; the prior applications are herewith incorporated by reference in their entireties.

FIELD AND BACKGROUND OF THE INVENTION

The invention concerns a drying device according to the preamble of the independent device claim, and a method for drying a sheet-like substrate in a continuous system according to the preamble of the independent method claim.

Sheet-like substrates are often treated with liquids, after which it is necessary to then dry the sheet-like substrate. For example, in the production of solar cells, semiconductor substrates—which constitute sheet-like substrates and are often described as wafers—are processed in a wet chemical method. In this context, it is usually necessary to dry the semiconductor substrates, in some cases after prior rinsing in water.

When sheet-like substrates are treated or processed on an industrial scale, for example in the industrial production of solar cells from semiconductor substrates, this regularly takes place with continuous processes and continuous systems through which the sheet-like substrates are transported. It is known, for the purpose of drying the semiconductor substrates in such continuous processes, to conduct air through perforated plates or similar on the top side and underside of the semiconductor substrate, and displace any liquid present on the surface by means of the inflowing air. It has however been found that with high transport speeds of the sheet-like substrates through corresponding continuous systems, it is not possible to achieve satisfactory drying results, and liquid droplets or damp regions can remain. This is the case even if the sheet-like substrates are dried in the manner described twice in succession.

SUMMARY OF THE INVENTION

In this context, the object of the present invention is to provide a device by means of which sheet-like substrates can be reliably dried in continuous operation.

This object is achieved with a drying device with the features of the independent device claim.

Furthermore, the invention is based on the object of providing a method by means of which sheet-like substrates can be reliably dried in a continuous system at high transport speeds of the sheet-like substrates through the continuous system.

This object is achieved by a method with the features of the independent method claim.

Advantageous refinements are the subject of the dependent claims.

The drying device according to the invention comprises at least one upper drying head and at least one lower drying head. The at least one upper drying head is arranged above a transport plane in which objects to be dried can be transported through the drying device in a transport direction. The at least one lower drying head is arranged below said transport plane. The at least one upper drying head and the at least one lower drying head each comprise at least one air outlet slot. Said air outlet slots are formed and arranged such that longitudinal directions of said air outlet slots extend substantially parallel to the transport plane and transversely to the transport direction. Furthermore, they are formed and arranged such that slot planes, in which said air outlet slots run, intersect the transport plane at angles which are greater than 0° and less than 90°.

The term "air outlet slot" in the present case should not be understood to mean that air must necessarily be used for drying. Instead, in principle other gases or gas mixtures may be used as a drying medium. Where the present description mentions "air", this term also always includes other gases or gas mixtures which could be used for drying.

It has been found that with the drying device described, sheet-like substrates can be reliably dried in continuous operation even at high transport speeds of the sheet-like substrates through the drying device.

In principle, said angles may be different for all slot planes. In a preferred variant however, said angles are selected uniformly for the slot planes in which the at least one air outlet slot of the at least one upper drying head runs, and said angles assume a first measured value. Furthermore, in this variant, said angles are selected uniformly for the slot planes in which the at least one air outlet slot of the at least one lower drying head runs, and said angles assume a second measured value. Particularly preferably, said angles are the same for all slot planes, i.e. the first measured value and the second measured value are identical.

By means of said air outlet slots, advantageously continuous air jet fronts may be formed. For this, in connection with silicon semiconductor substrates, air outlet slots with a length of 180 mm have proved useful.

In particular in connection with the drying of semiconductor substrates made of silicon, it has proved advantageous for the drying results if the slot planes, in which said air outlet slots run, intersect the transport plane at angles which are greater than 60° and less than 80°. Preferably, these angles are greater than 65° and less than 75°, and particularly preferably amount to 70°.

Preferably, the air outlet slots have a uniform slot depth of between 1 mm and 5 mm. Preferably, the slot depth amounts to between 2 mm and 4 mm, and particularly preferably between 2.5 mm and 3.5 mm. These slot depths have proved particularly suitable in practice.

The air outlet slots preferably have a slot width which is greater than or equal to 0.3 mm and less than or equal to 0.7 mm. Particularly preferably, the slot width amounts to 0.5 mm. In this way, efficient drying can be achieved.

It has been found that a constant slot cross-section has substantial influence on the drying result. In order to stabilize the form and hence the cross-sections of the air outlet slots, in an advantageous refinement therefore stiffening webs are provided which are suitable for stabilizing the forms of the air outlet slots over their slot length. This is particularly advantageous if greater slot lengths are selected which extend over an entire width of the sheet-like substrates to be dried.

In a preferred embodiment variant of the drying device, at least one drying head has a base plate in which a pocket for air guidance is machined. Furthermore, a cover is provided which can be connected to the base plate and by means of which the pocket can be closed so as to form a cavity. This cavity then serves for so-called air guidance in the drying head towards the air outlet slots. This allows favorable production of the at least one drying head. Preferably, all drying heads are configured in the manner described. The term "air guidance" in the present case includes the guidance of another gaseous drying medium. Several covers of various drying heads may be connected together via a pipeline through which medium can flow. Preferably, in each case, two covers are connected together directly by such pipelines. This allows an even air distribution.

A refinement of the drying device provides an angled plate which is suitable and provided for stiffening at least one drying head. Such an angled plate may then be laid in the pocket machined in the base plate, or attached externally to the base plate. Preferably, all drying heads are provided with an angled plate.

Advantageously, the longitudinal direction of at least one air outlet slot extends transversely to the transport direction, such that said longitudinal direction deviates from the transport direction by an angle of 87° or less. This can prevent an air jet, which emerges from said at least one air outlet slot, from making contact parallel to a rear edge of the sheet-like substrates to be dried. Due to the avoidance of this parallel contact, when passing through the drying device, any liquid present on the rear edge can be pushed from one end of the rear edge to the opposite end of the rear edge by the air jet running obliquely relative to the rear edge. This is advantageous in particular if the liquid has a tendency to adhere to edges. Preferably, said angle amounts to more than 75° and is less than or equal to 87°. In this way, it is possible to take account of the restricted spatial conditions in continuous systems, in particular in the case of multitrack systems in which the sheet-like substrates to be dried are transported through the drying device on several tracks next to each other. An angle of 87° has proved particularly suitable in practice.

In some applications, it may be advantageous if the longitudinal directions of all air outlet slots extend transversely to the transport direction in the manner described above. This may be the case for example when the liquid has a very strong tendency to adhere to edges. In addition, in this way, stabilization may be achieved if the sheet-like substrates have a tendency to vibrations. Such vibrations may be caused by the deflection effects of air jets in the drying device. Above all in the case of thin sheet-like substrates, such vibrations may lead to breakage of the sheet-like substrate.

A refinement of the invention provides that the longitudinal direction of at least one air outlet slot extends substantially perpendicularly to the transport direction. This may be advantageous in the case of restricted spatial conditions in the transport direction, in particular if stabilization slots (described below) are also provided. When the spatial conditions in the transport direction are particularly restricted, it may be advantageous if the longitudinal directions of all air outlet slots extend perpendicularly to the transport direction. The drying heads may then be constructed particularly compactly.

In an advantageous embodiment variant of the drying device, an upper drying head and a lower drying head, forming a drying head pair, are arranged above each other such that the slot planes, in which the air outlet slots of the upper drying head of the drying head pair run, form intersection lines with the transport plane which coincide with intersection lines formed with the transport plane by the slot planes in which the air outlet slots of the lower drying head of the drying head pair run. In this way, the sheet-like substrate may be quasi-enclosed by a closed air jet ring. This allows a particularly efficient drying.

Alternatively or in a further drying head pair, it may advantageously be provided that an upper drying head and a lower drying head, forming a drying head pair, are arranged above each other such that the slot planes, in which the air outlet slots of the upper drying head of the drying head pair run, form first intersection lines with the transport plane which run parallel to second intersection lines formed with the transport plane by the slot planes in which the air outlet slots of the lower drying head of the drying head pair run. Furthermore, the arrangement is such that the first intersection lines are offset in the transport direction relative to the second intersection lines by a value between 1 mm and 5 mm. Preferably, this offset amounts to between 1 mm and 3 mm, and particularly preferably 2 mm. In this variant, the air jets from the upper drying head and the lower drying head do not make contact at mutually opposing locations on the top side and underside of the sheet-like substrate, but are offset to each other. This may lead to a less efficient drying, but on the other hand, in this way, the above-mentioned tendency to vibration, which occurs in many applications with the associated risk of breakage, can be reduced or avoided. In practice, an arrangement in which the first intersection lines are offset downstream in the transport direction relative to the second intersection lines has proved particularly suitable.

In an advantageous variant, at least two drying head pairs are provided which are arranged successively in the transport direction. These two drying head pairs may be configured identically. In principle, the two drying head pairs may however also be different, in order to meet the requirements of the respective application. For example, in the case of a second drying head pair, the drying heads could be arranged such that the first and second intersection lines are offset to each other in the manner described above, while in the first drying head pair, the drying heads are arranged such that the intersection lines coincide as described further above.

A refinement proposes that an upper drying head and a lower drying head, forming a drying head pair, are arranged above each other. The upper and the lower drying heads of the drying head pair each have at least one stabilizing slot through which medium can flow. Said stabilizing slots are each arranged offset in the transport direction next to an air outlet slot. Furthermore, said stabilizing slots are formed and arranged such that their longitudinal directions extend substantially parallel to the transport plane and transversely to the transport direction at an angle deviating from 90°. Furthermore, the at least one stabilizing slot of the upper drying head and the at least one stabilizing slot of the lower drying head are arranged in pairs, such that an air front flowing out of the stabilizing slot of a stabilizing slot pair arranged in the upper drying head, in the transport plane, intersects the air front flowing out of the stabilizing slot of this stabilizing slot pair arranged in the lower drying head. Or in other words, the stabilizing slots of the stabilizing slot pair are oriented contrary to each other relative to the transport direction, so that the air fronts flowing out of the stabilizing slots of this stabilizing slot pair intersect in the transport plane.

By means of the stabilizing slots, the tendency (already described above) of many sheet-like substrates to vibrate, and the associated risk of breakage, are further reduced. It is also possible to use stabilizing slots instead of other measures for avoiding vibrations. The drying device may thus be designed optimally for the respective application and its peripheral conditions, such as for example restricted spatial conditions. For example, a combination of stabilizing slots and air outlet slots extending substantially perpendicularly to the transport direction may prove highly advantageous in restricted spatial conditions and when there is a vibration tendency. Amongst others, in this exemplary case it may be advantageous if all air outlet slots of the drying device, or at least the drying head pair, extend substantially perpendicularly to the transport direction.

The method according to the invention for drying a sheet-like substrate in a continuous system provides that an upper air jet extending over the entire width of the sheet-like substrate flows onto a top side of the sheet-like substrate. At the same time, a lower air jet extending over the entire width of the sheet-like substrate flows onto an underside of the sheet-like substrate. The upper and lower air jets flow onto the top side and the underside of the sheet-like substrate at angles relative to a transport plane, in which the sheet-like substrate is transported, which are greater than 0° and less than 90°.

The term "top side" of the sheet-like substrate means a first large-area side of the sheet-like substrate; the term "underside" means a second large-area side of the sheet-like substrate. The medium does not necessarily make contact with the top side and underside of the sheet-like substrate at the same angles; said angles may in principle differ from each other, in particular if this proves advantageous in the respective application. Normally however, the contact angles are the same.

The method according to the invention allows sheet-like substrates to be reliably dried in continuous systems even at high transport speeds through the continuous system, in particular a transport speeds of more than 2.6 m/minute. With inflow from air jets extending over the entire width of the sheet-like substrate, almost no liquid can escape the air jets. The sheet-like substrate can be reliably dried over its entire width.

Preferably, the upper air jet flows onto the top side of the sheet-like substrate, and the lower air jet flows onto the underside of the sheet-like substrate, against a transport direction in which the sheet-like substrate is transported in the transport plane. The term "against the transport direction" in the present case means that a flow direction of the air jet has a direction component which is oriented opposite the transport direction.

Advantageously, the upper air jet flows onto the top side and the lower air jet flows onto the underside of the sheet-like substrate at angles relative to a transport plane, in which the sheet-like substrate is transported, which are greater than 60° and less than 80°. Preferably, these angles are greater than 65° and less than 75°. In practice, an angle of 70° has proved particularly suitable.

Preferably, the upper air jet and the lower air jet are oriented such that they make contact with the sheet-like substrate in mutually opposing regions, which lie firstly on the top side of the sheet-like substrate and secondly on the underside of the sheet-like substrate. In this way, a composite air jet may be formed which peripherally surrounds the sheet-like substrate. It is extremely difficult for liquid to escape such a surrounding air jet form, so efficient drying can be achieved.

In a refinement, the upper air jet and the lower air jet are oriented such that they make contact with the sheet-like substrate offset to each other in the transport direction by a value between 1 mm and 5 mm. Preferably, said value is between 1 mm and 3 mm, and particularly preferably 2 mm. As already explained in connection with the drying device, in this way, in applications in which the sheet-like substrates have a tendency to form vibrations, this vibration tendency may be countered and the associated risk of breakage reduced or even eliminated. In practice, it has proved suitable to orient the upper and lower air jets such that the upper air jet is offset relative to the lower air jet downstream in the transport direction when it makes contact with the sheet-like substrate.

Advantageously, the upper and lower air jet make contact with a rear edge of the sheet-like substrate in contact flow directions which are obliquely angled, such that the rear edge encloses an angle of 3° or more with the inflow direction of the upper air jet and also with the inflow direction of the lower air jet. Preferably, said angles amount to less than 15° and are greater than or equal to 3°. Particularly preferably, the angles amount to 3°. As already explained above, in this way, in the case of liquids with a tendency to adhere to edges, a more efficient drying can be achieved. Because of the contact flow direction described, which runs obliquely relative to the rear edge, the liquid may be dispelled from one end of the rear edge to the other end where it is largely or completely detached. Also, in corresponding applications, the tendency of sheet-like substrates to form vibrations may be countered. The contact flow directions of the upper and lower air jets may in principle vary with respect to the angle enclosed with the rear edge; preferably however, the same angular value is selected.

In an advantageous embodiment variant, several upper and several lower air jets flow onto the sheet-like substrate, wherein in each case one upper and one lower air jet form an air jet pair, and the air jets of the different air jet pairs are offset relative to each other in the transport direction when they make contact with the sheet-like substrate. In this way, the drying effect can be improved if required.

If there is a need to stabilize the sheet-like substrate, in particular to avoid vibrations and the associated risk of breakage, then preferably, in order to stabilize the sheet-like substrate, an upper stabilizing air jet flows onto the top side and a lower stabilizing air jet flows onto the underside. The lower stabilizing air jet preferably has a flow direction which is oriented opposite a flow direction of the upper stabilizing air jet. This measure may be carried out alternatively or additionally to other steps serving to avoid vibrations of the sheet-like substrate. The flow directions of the stabilizing air jets may particularly preferably be selected parallel to a surface normal of the transport plane.

An advantageous refinement provides that the upper stabilizing air jet forms a jet profile which runs contrary to a jet profile of the lower stabilizing air jet. The term "contrary jet profile" means the following: the jet profiles of the upper and lower stabilizing air jets are configured such that, in the case of contact of the upper stabilizing air jet onto the lower stabilizing air jet with opposing flow direction, on a projection of the jet profiles in the flow direction, the resulting intersection point lies in a projection image of the two jet profiles. Preferably, this intersection point lies approximately in the middle of the projection image. Particularly preferably, the jet profiles are formed to be axially symmetrical to an axis running through the intersection point. In this way, by air inflow onto comparatively small surface regions of the sheet-like substrate, a good stabilizing effect can be achieved.

Preferably, during drying of the sheet-like substrate, the sheet-like substrates are transported through the continuous system with a speed of more than 2.6 m/minute. In this way, good and reliable drying results can be achieved with a comparatively high throughput rate.

The invention is now described in more detail below with reference to figures. Where suitable, elements with the same function carry the same reference signs. The invention is not restricted to the exemplary embodiments shown in the figures, including in relation to functional features. The above description and the following description of the figures contain numerous features, which in some cases have been combined into groups in the dependent subclaims. These features, as all other features disclosed above and in the figure description below, may however be considered individually by the person skilled in the art and combined into suitable further combinations. In particular, all said features may be used both individually and combined into any suitable combination with the drying device and/or the method of the independent claims.

DETAILED DESCRIPTION OF THE INVENTION

Figure 1:
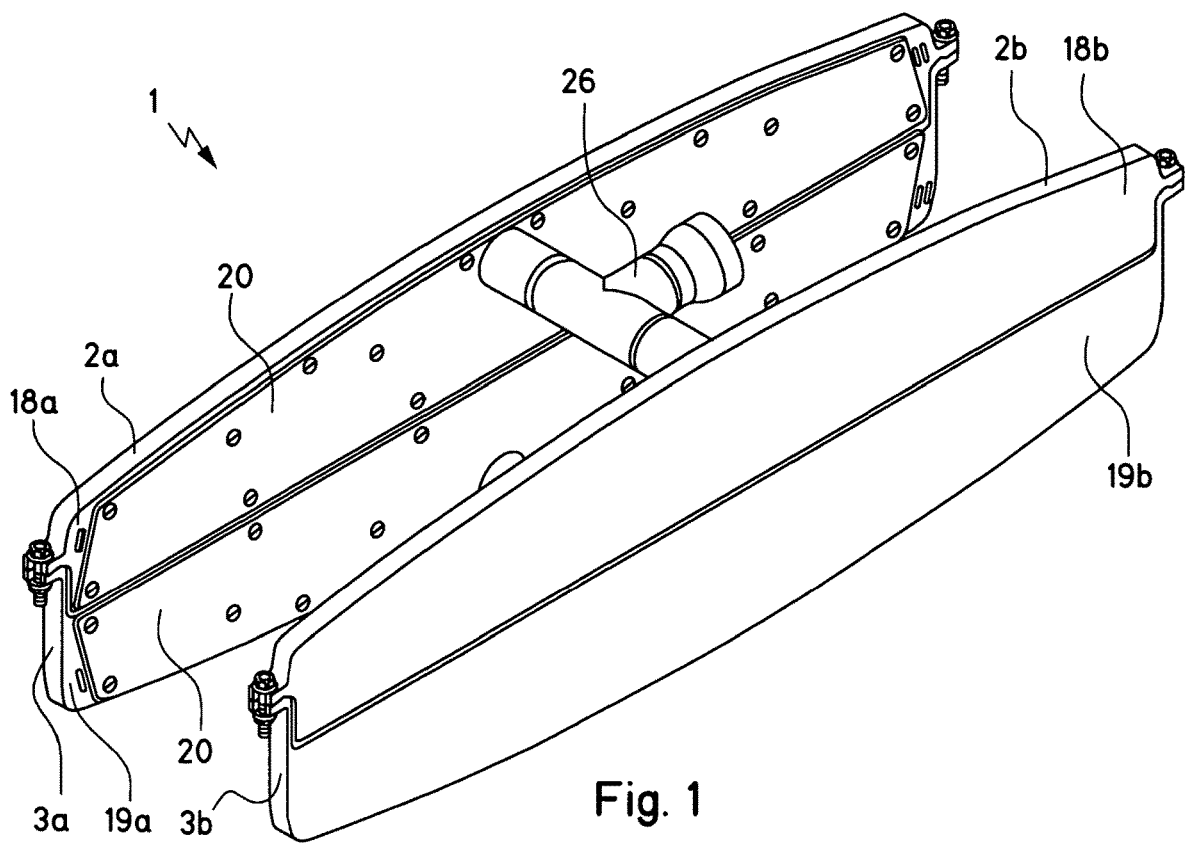
FIG. 1 a first exemplary embodiment of a drying device.
Figure 2:
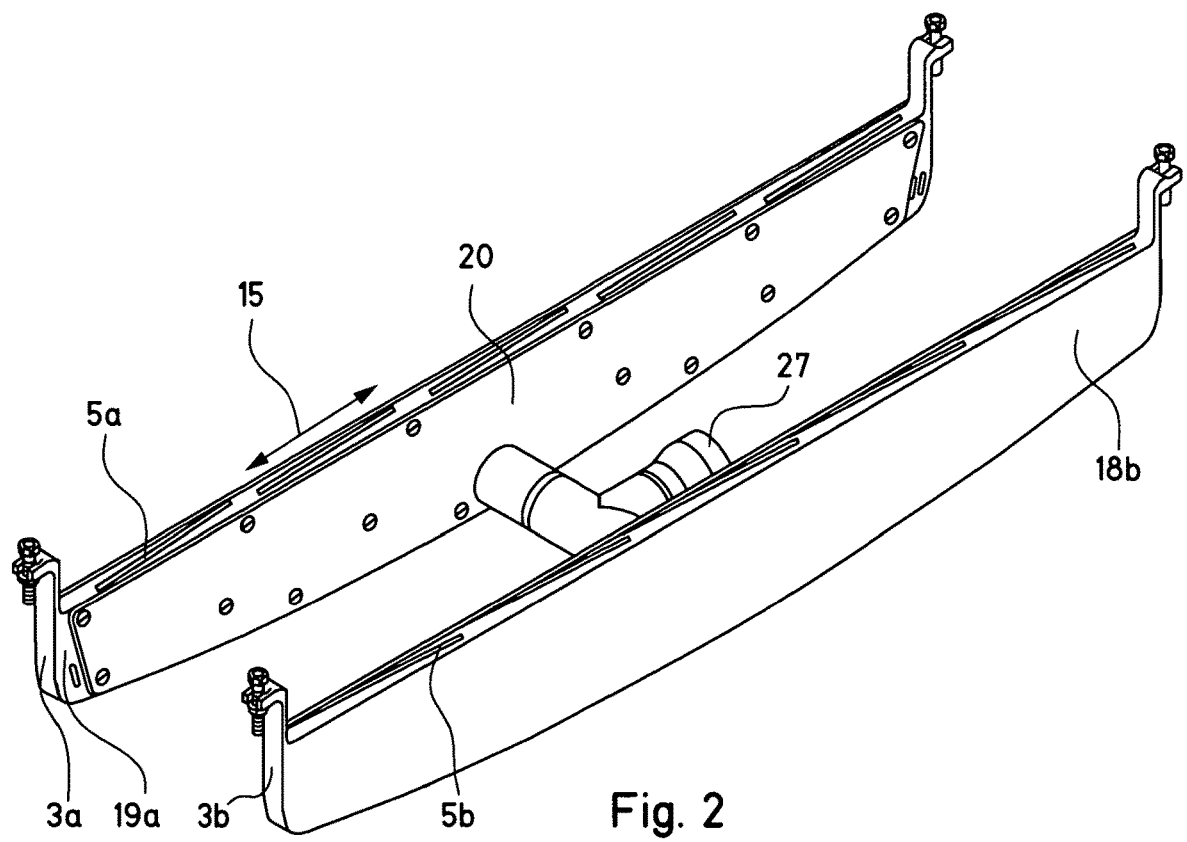
FIG. 2 a partial depiction of the drying device from FIG. 1.

FIG. 1 shows a first exemplary embodiment of the drying device. The drying device 1 depicted therein has two upper drying heads 2a, 2b and two lower drying heads 3a, 3b. The upper drying head 2a and the lower drying head 3a on one side, and the upper drying head 2b and the lower drying head 3b on the other, are connected into respective drying head pairs. The drying device 1 is explained in more detail below with reference to FIGS. 1 to 6. FIG. 2 shows the two lower drying heads 3a, 3b in perspective view. This depiction shows the air outlet slots 5a, 5b which are arranged in the lower drying heads 3a, 3b. The air outlet slot 5a is also shown in the enlarged partial depiction of the lower drying head 3a in FIG. 3, and in FIG. 4.

Figure 4:
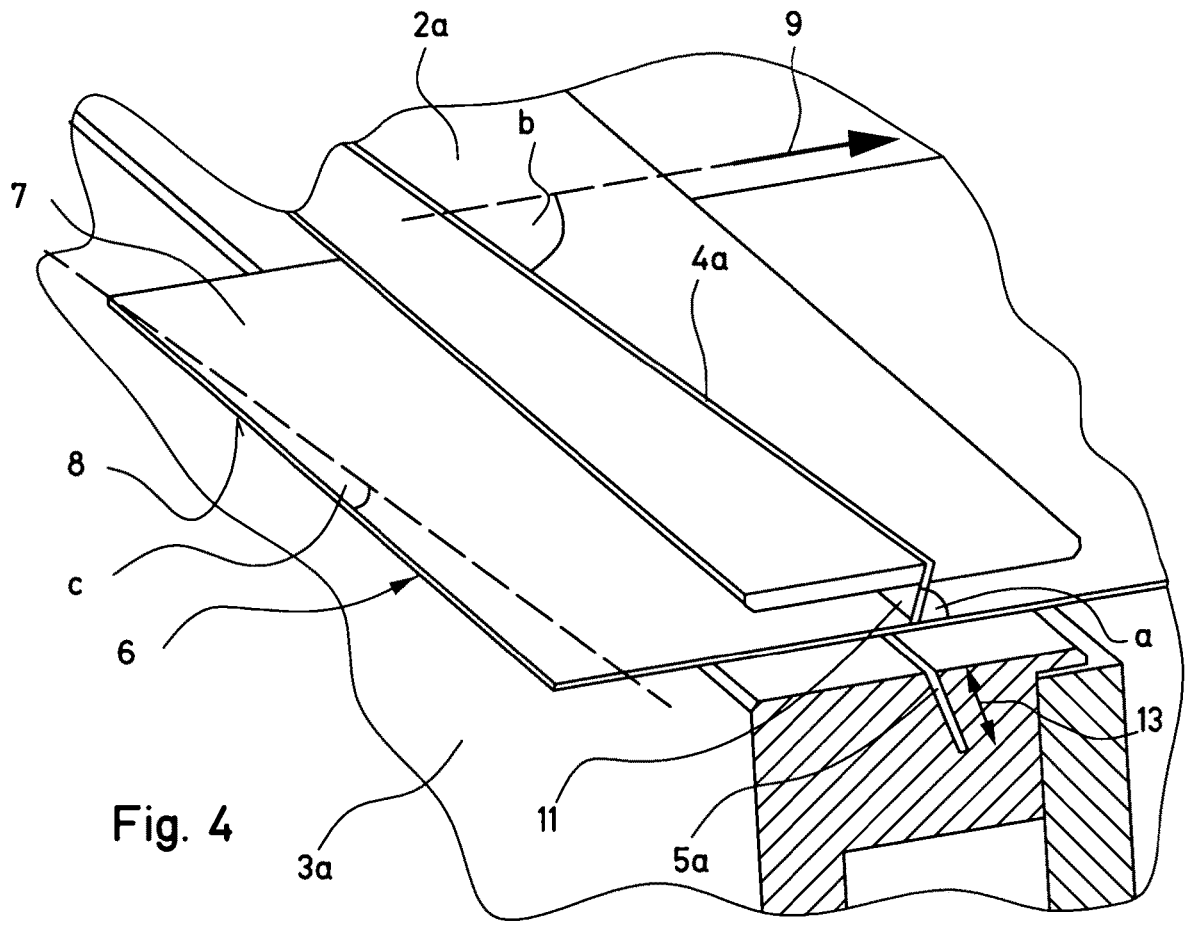
FIG. 4 a partial depiction of the drying device in FIG. 1 during continuous passage of a semiconductor substrate.

FIG. 4 also shows a semiconductor substrate which is transported straight through the drying device 1 in a transport direction 9. An underside of the semiconductor substrate runs in a transport plane 8. The upper drying head 2a is only partly shown in the depiction of FIG. 4 for the sake of clarity. The figure however shows an upper air outlet slot 4a. FIGS. 1 and 4 thus show that the upper drying heads 2a, 2b are arranged above the transport plane 8, while the lower drying heads 3a, 3b are arranged below the transport plane 8. As FIG. 2 shows, the lower drying heads 3a, 3b have several air outlet slots 5a, 5b. The upper drying heads also have several air outlet slots.

Longitudinal directions of all air outlet slots extend parallel to the transport plane 8 and transversely to the transport direction 9, as shown in FIG. 4. Openings of the air outlet slots 4a, 4b, 5a, 5b run in respective slot planes and span these. A slot plane 11 belonging to the air outlet slot 4a of the upper drying head 2a is indicated diagrammatically in FIG. 4. This slot plane 11 intersects the transport plane 8 at an angle a. This angle a is greater than 0° and also less than 90°. Preferably it amounts to 70°. As evident from FIG. 4, the same angular conditions prevail for the slot plane belonging to the lower air outlet slot 5a.

Figure 3:
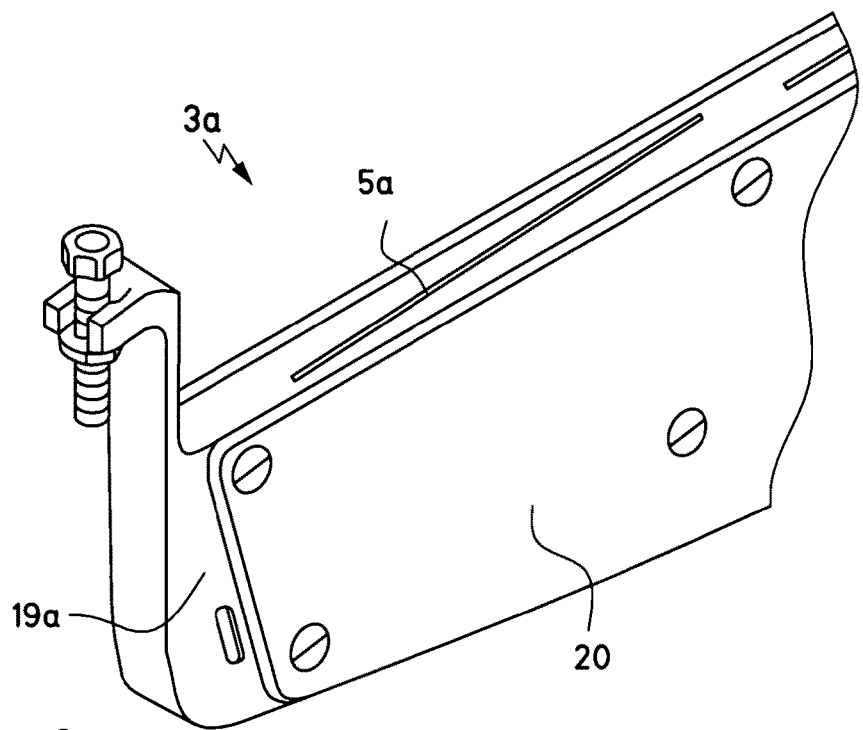
FIG. 3 a partial depiction of a drying head from FIG. 2.
Figure 5:
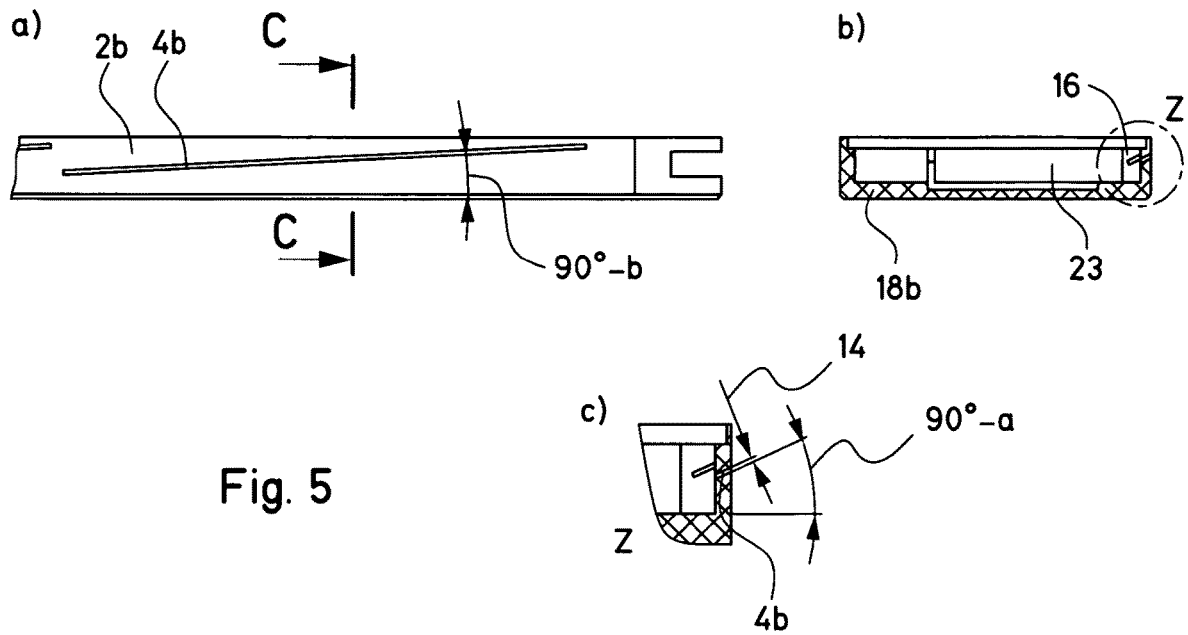
FIG. 5(a) a partial sectional depiction, (b) a sectional depiction and (c) a detail depiction of a drying head from FIG. 1.
Figure 6:
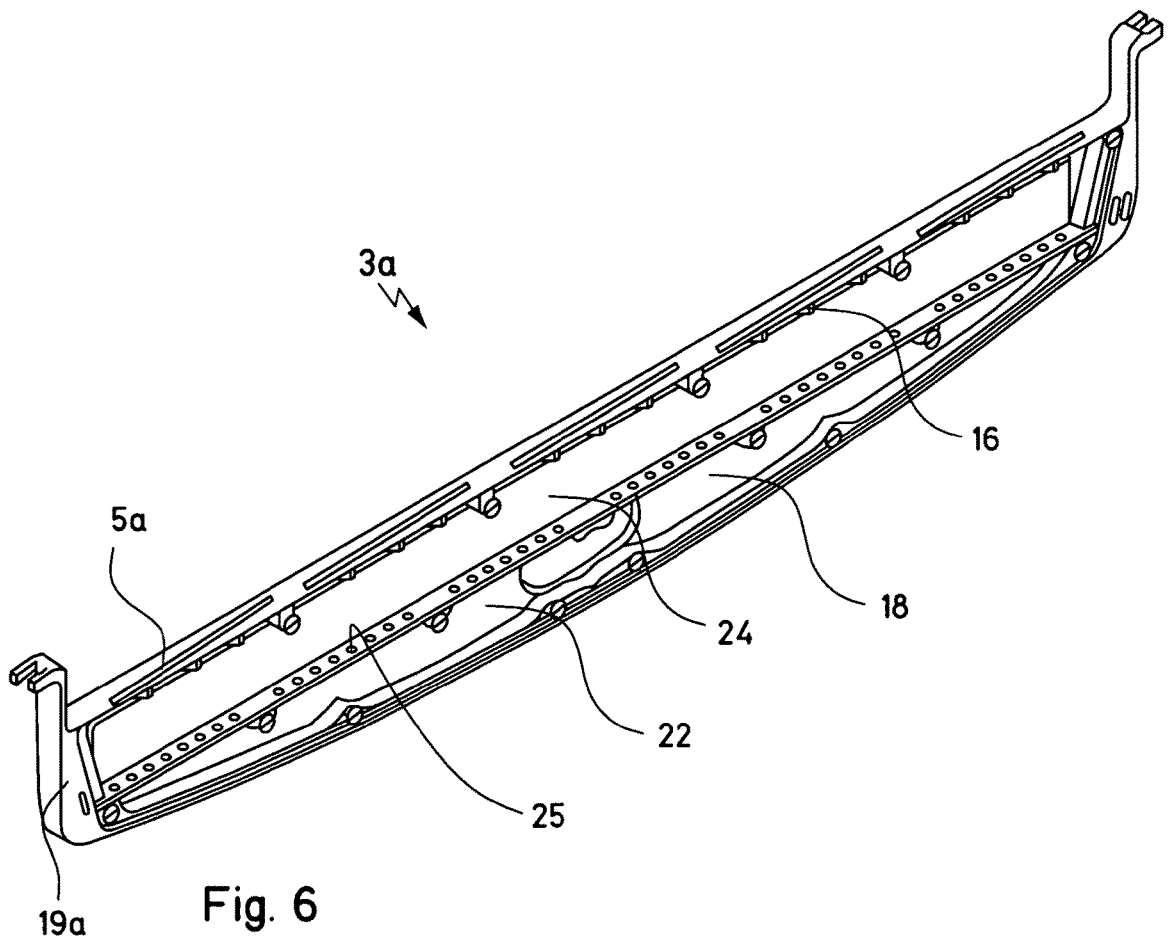
FIG. 6 a drying head of the drying device from FIG. 1 with the cover removed.

FIG. 5a) shows in a partial depiction an underside view of the upper drying head 2b. FIG. 5b) shows a sectional depiction through this upper drying head 2b along line C-C from FIG. 5a). As can be seen, a cover 20, which is shown in FIGS. 1 and 3 and provided for all drying heads, is not taken into account in the depictions of FIG. 5. FIG. 5 therefore shows the upper drying head 2b with the cover 20 removed.

The air outlet slots 4a, 4b, 5a, 5b in the drying device 1 all have a uniform slot depth 13 (see FIG. 4) which is 3 mm. A detail depiction of the partial region Z from FIG. 5b) (shown in FIG. 5c)), illustrates a slot width 14. This amounts to a uniform 0.5 mm. It has been found that a constant slot cross-section has considerable influence on the drying result. In order to stabilize the form and hence the cross-sections of the air outlet slots 5a, 5b, 4a, 4b, therefore reinforcing webs 16 are provided in the drying device 1. These are arranged with a mutual spacing of around 5 cm. In this way, the dimensional stability of the air outlet slots 4a, 4b, 5a, 5b may be increased.

As evident from FIGS. 2 to 6, the longitudinal directions of the air outlet slots 4a, 4b, 5a, 5b thus extend transversely to the transport direction 9, such that said longitudinal directions deviate from the transport direction by an angle b which amounts to 87° or less. In the case of the drying device 1, it amounts to 87°. Consequently, the angle (90°−b) shown in FIG. 5a) amounts to 3°.

The drying device 1 is a drying device for a multitrack system, more precisely for a five-track system. The semiconductor substrates 7 may pass through the drying device in five tracks next to each other. The air outlet slots 4a, 4b, 5a, 5b are provided for each track. A slot length 15 of the air outlet slots 4a, 4b, 5a, 5b extends over the entire width of the semiconductor substrate (see FIG. 4). In the case of silicon semiconductor substrates, a slot length 15 of 180 mm has proved suitable.

The upper drying head 2a and the lower drying head 3a are arranged above each other such that the slot plane 11 forms an intersection line with the transport plane 8 which coincides with an intersection line formed with the transport plane 8 by the slot plane belonging to the lower air outlet slot 5a. As a result, over its entire length, an air jet emerging from the upper air outlet slot 4a meets an air jet emerging from the lower air outlet slot 5a in the transport plane 8. The same applies to the upper drying head 2b and lower drying head 3b, and the air outlet slots 4b, 5b arranged therein.

All drying heads 2a, 2b, 3a, 3b have base plates 18a, 18b, 19a, 19b, in each of which a pocket 22 for air guidance has been machined. This is shown as an example in FIG. 6 for the lower drying head 3a, which to this end is depicted there with the cover 20 removed. When the cover 20 is mounted, the pocket 22 forms a cavity 23 which serves for air guidance. In the interests of a uniform drying result across the various tracks of the drying device, an even flow distribution in the drying heads 2a, 2b, 3a, 3b must be ensured. To this end, an angled plate 24, which has hole bores 25 for even air distribution, is inserted in each drying head 2a, 2b, 3a, 3b. In addition, the angled plate 24 serves to stiffen the drying head 3a.

In the case of the drying device 1, the upper drying heads 2a, 2b are connected together by means of a common upper pipe supply line 26. Accordingly, the lower drying heads 3a, 3b are connected together by means of a common lower pipe supply line 27. Air or another gas mixture used for drying is supplied to the drying device 1 via said pipe supply lines 26, 27.

Figure 7:
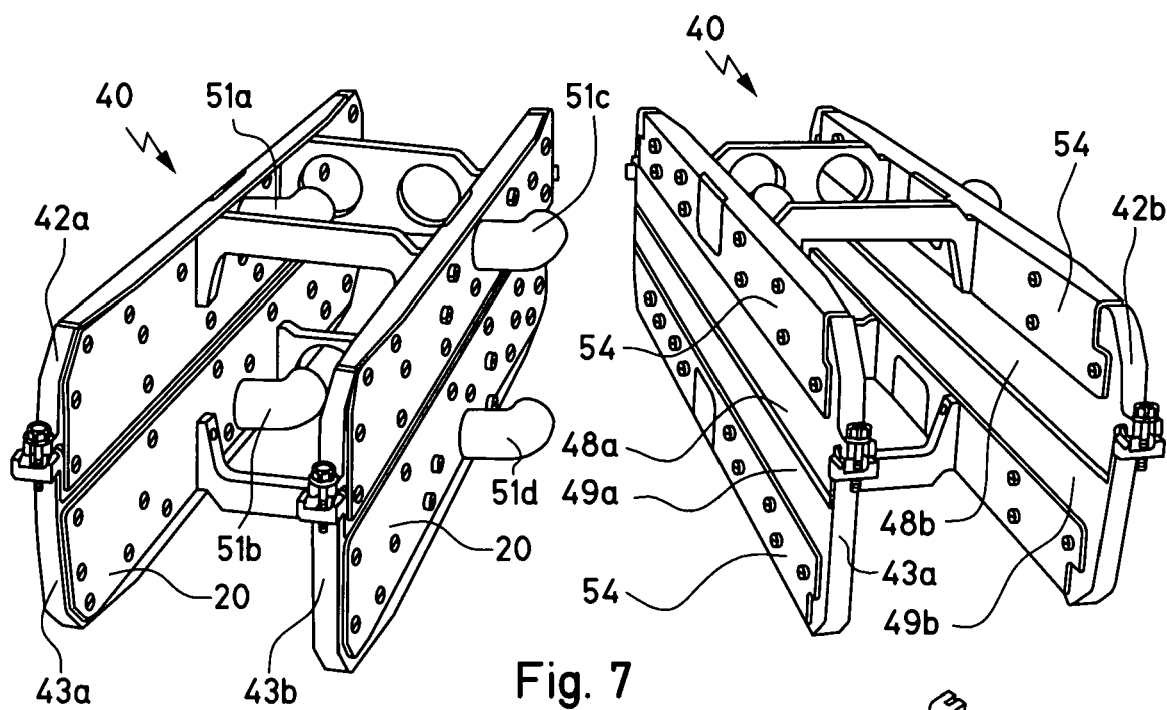
FIG. 7 perspective views of a second exemplary embodiment of the drying device.
Figure 8:
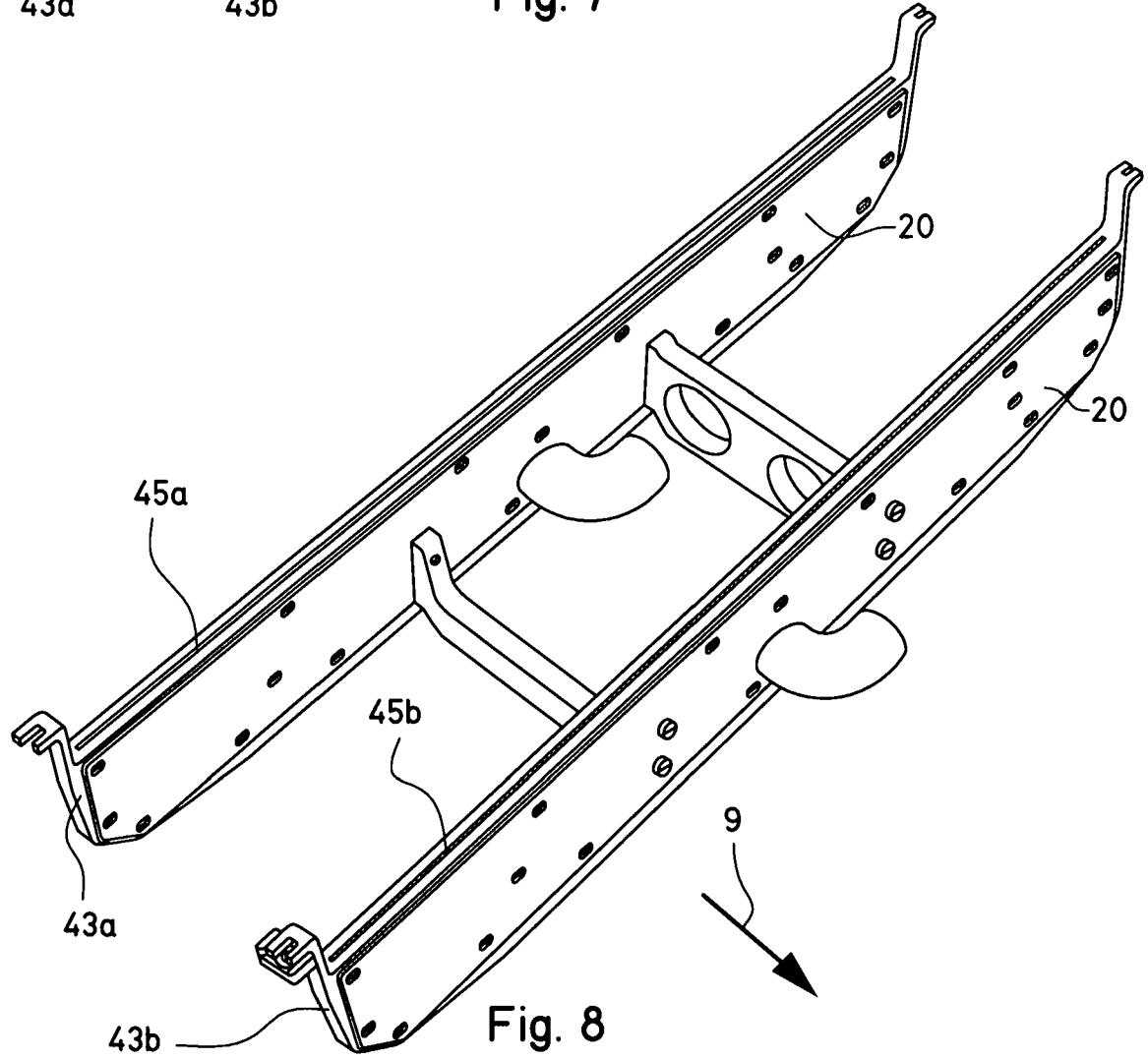
FIG. 8 a partial depiction of the drying device from FIG. 7.
Figure 9:
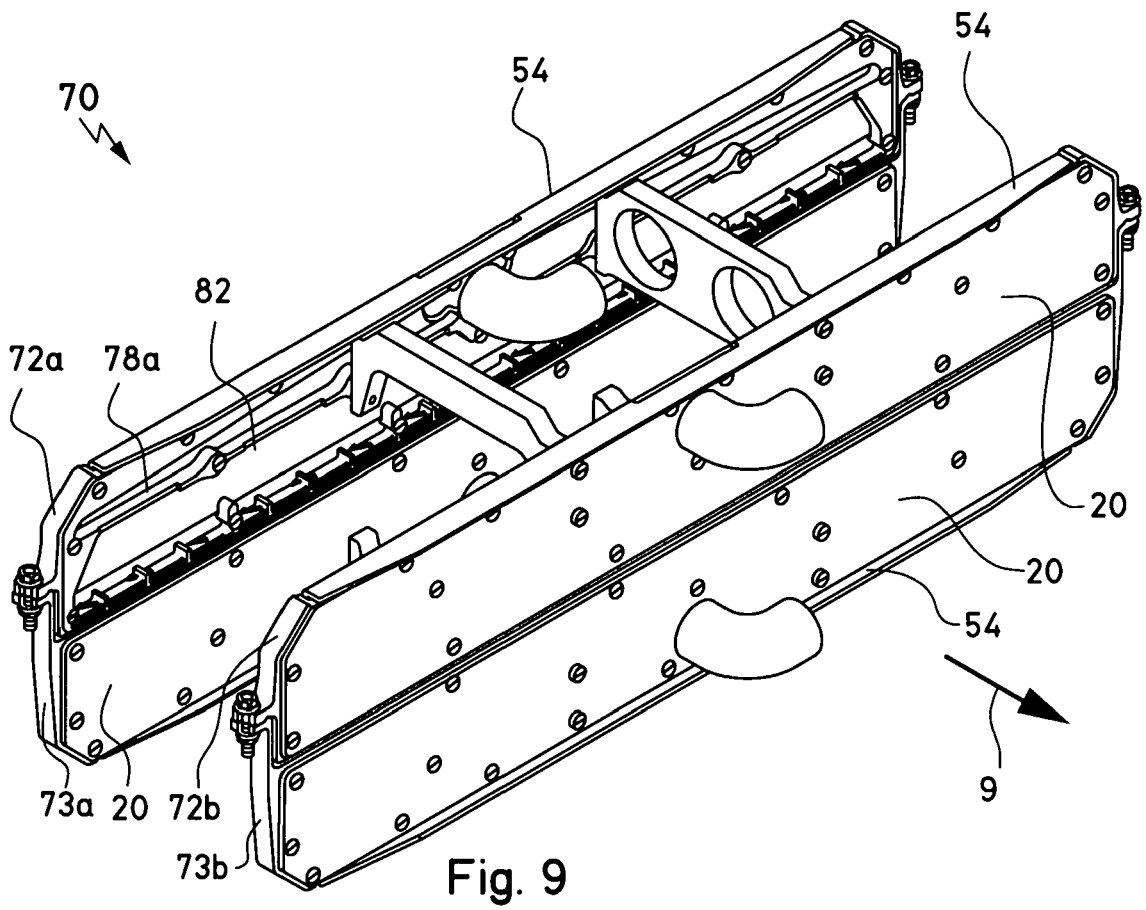
FIG. 9 a third exemplary embodiment of the drying device.

FIGS. 7 and 8 illustrate a further exemplary embodiment of the drying device. FIG. 7 shows two perspective depictions of the drying device 40 from different viewing angles. As in the case of the drying device 1, the drying device 40 has two upper drying heads 42a, 42b and two lower drying heads 43a, 43b, which form two drying head pairs 42a, 43a and 42b, 43b. Instead of the upper and lower pipe supply lines 26, 27 in the drying device 1, separate hose supply lines 51a, 51, 51c, 51d are provided for each drying head 42a, 42b, 43a, 43b in the drying device 40. They serve correspondingly for the supply of air or another drying medium.

In the same way as in the case of the drying device 1, each of the drying heads 42a, 42b, 43a, 43b has a base plate 48a, 48b, 49a, 49b in which a pocket is machined which can be closed by means of a cover 20. However, in the case of the drying device 40, an angled plate 54 serving for stiffening is not arranged in the pockets but is attached externally to the drying heads 42a, 42b, 43a, 43b. This may prevent metallic contamination, originating in the angled plates, from reaching the semiconductor substrates by means of air flowing through the pockets, and contaminating these substrates.

In contrast to the drying device 1, continuous air outlet slots 45a, 45b are provided in the drying device 40. As shown in FIG. 8, these extend substantially perpendicularly to the transport direction 9.

The drying device 40 may however be used in multitrack systems. In the upper drying heads 42a, 42b, correspondingly designed air outlet slots are provided. However, they are arranged offset relative to the air outlet slots 45a, 45b of the lower drying heads 43a, 43b. When viewing the slot planes in which the air outlet slots of the upper drying heads 42a, 42b run, and first intersection lines which these form with the transport plane 8, running in the same way as in the case of the drying device 1, these first intersection lines no longer coincide with second intersection lines formed with the transport plane 8 by the slot planes in which the air outlet slots 45a, 45b of the lower drying heads 43a, 43b run. Rather, for each drying head pair 42a, 43a or 42b, 43b, the first intersection line is offset in the transport direction relative to the second intersection line. Air jets originating from the upper drying heads 42a, 42b thus, in the respective drying head pair, make contact with the semiconductor substrate 7 opposite air jets from the air outlet slots 45a, 45b of the lower drying heads 43a, 43b with an offset in the transport direction. As explained in more detail above, in this way in certain applications, it is possible to reduce the formation of vibrations of the semiconductor substrate during the drying process and the associated risk of breakage.

FIGS. 9 to 12 illustrate a further exemplary embodiment of the drying device. The drying device 70 shown here again has two upper drying heads 72a, 72b and two lower drying heads 73a, 73b. As in the case of the drying device 40, continuous or at least approximately continuous air outlet slots 74a, 75a are arranged in the drying heads 72a, 72b, 73a, 73b, wherein the longitudinal directions of said slots extend substantially perpendicularly to the transport direction 9. In contrast to the drying device 40, in the drying device 70, the air outlet slots 74a, 75a of the upper drying heads 72a, 72b and lower drying heads 73a, 73b again lie above each other. Accordingly, an air jet originating from the air outlet slot 74a arranged in the upper drying head 72a, in the same way as in the case of the drying device 1, meets an air jet originating from the air outlet slot 75a of the lower drying head 73a in the transport plane 8.

Figure 11:
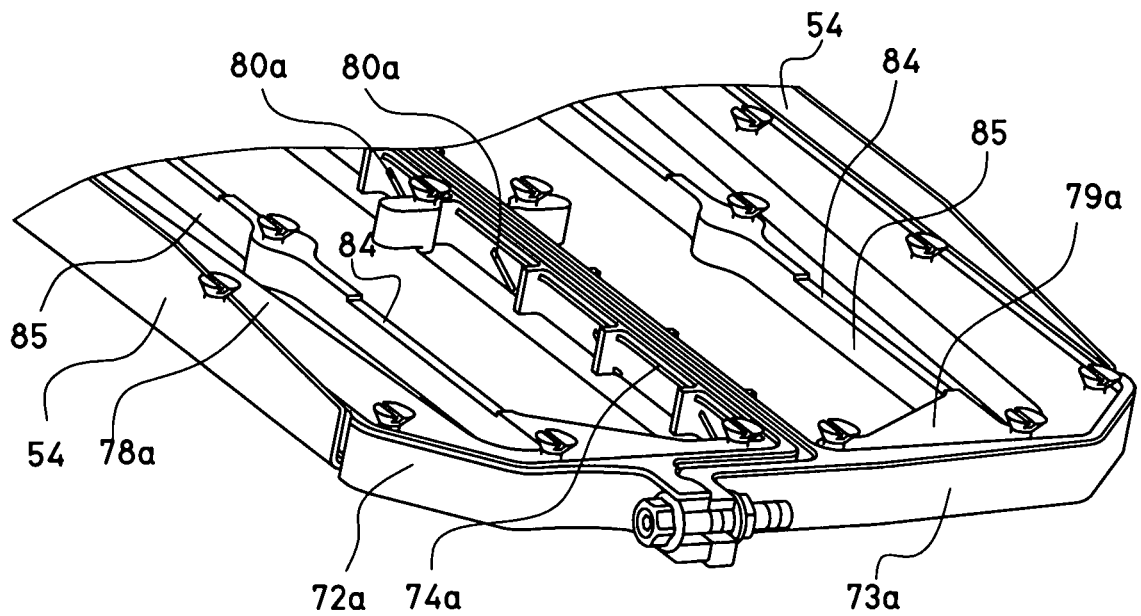
FIG. 11 a first perspective depiction of a drying head pair from FIG. 9.
Figure 12:
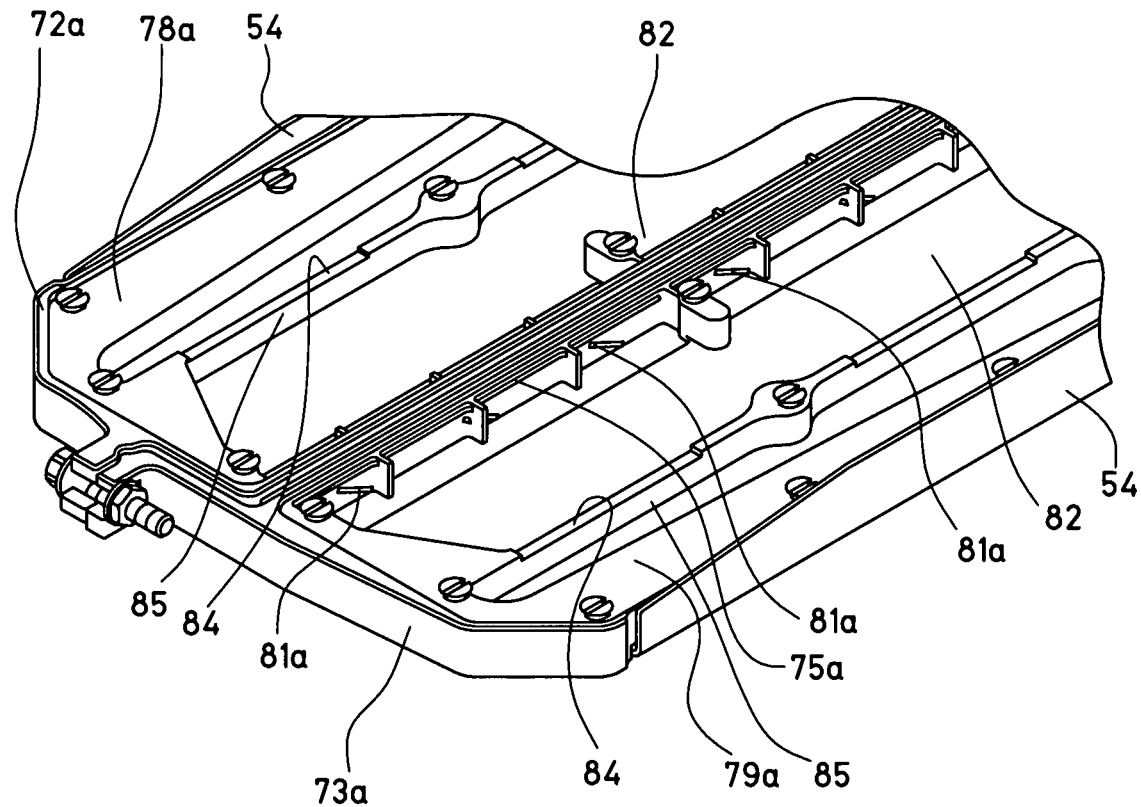
FIG. 12 a second perspective depiction of the drying head pair from FIG. 11.

However, the upper 72a and lower drying heads 73a of the drying head pair shown in FIGS. 11 and 12 have stabilizing slots 80a, 81a, through which air—or more precisely the drying medium—may flow. These are arranged offset in the transport direction 9 next to the air outlet slots 74a or 75a. The longitudinal directions of the stabilizing slots 80a, 81a extend parallel to the transport plane 8 and transversely to the transport direction 9 at an angle deviating from 90°. As a comparison of the partial depictions of FIGS. 11 and 12 shows, the stabilizing slots 80a in the upper drying head 72a are arranged contrary to the stabilizing slots 81a in the lower drying head 73a. In the case of the drying device 70, the stabilizing slots 80a, 81a are formed such that air emerging therefrom makes contact with the semiconductor substrate in a direction parallel to a surface normal of the transport plane 8. The stabilizing slots 80a, 81a are provided correspondingly in the drying heads 72b, 73b. As explained above, they may be used additionally or alternatively as means for reducing or avoiding vibrations of the semiconductor substrates to be dried.

Figure 10:
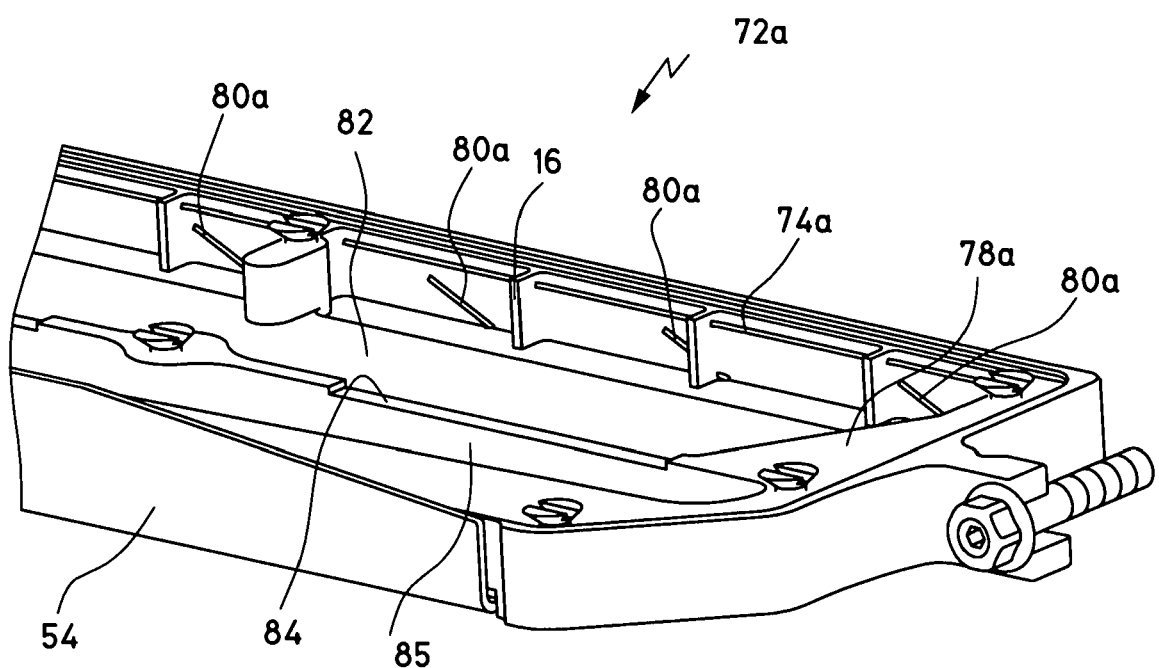
FIG. 10 a partial depiction of a drying head from FIG. 9.

As shown in FIGS. 10 to 12, the drying heads 72a, 72b, 73a, 73b have base plates 78a, 79a with pockets 82 formed therein and covers 20, in the same way as in the drying devices 1 and 40. The angled plate 54 serving for stiffening is mounted outside the pockets 82, as in the case of the drying device 40. Accordingly, no hole bores can be arranged in the angled plate 54 for distribution of the air into the pockets 82 over the various tracks, with associated air outlet slots 74a, 75a. The substantial and even distribution of the air flow within the pockets 82a, which is necessary for an even drying result over all tracks, must therefore be achieved in another fashion. To this end, cut-outs 84 are arranged in the webs 85 of the base plate 78a, 79a of the drying heads 72a, 72b, 73a, 73b. By means of these cut-outs 84 in the webs 85, an even distribution of air onto the different tracks can be achieved.

Figure 13:
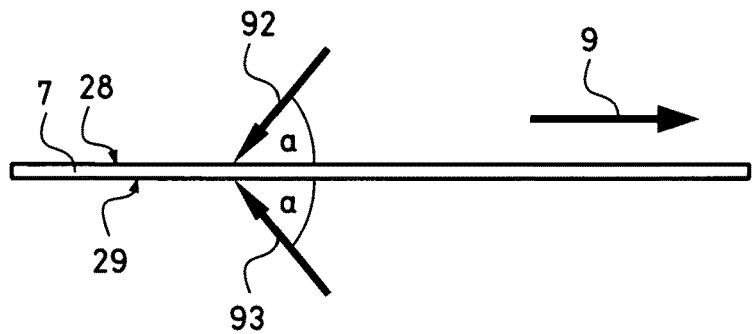
FIG. 13 a principle depiction of a first exemplary embodiment of the method.

FIG. 13 illustrates in a diagrammatic depiction a first exemplary embodiment of the method. Here, an upper air jet 92, which extends over the entire width of the semiconductor substrate 7, flows onto a top side 28 of the semiconductor substrate 7. At the same time, a lower air jet 93, which extends over the entire width of the semiconductor substrate 7, flows onto an underside 29 of the semiconductor substrate 7. Said air jets 92, 93 thus flow onto the top side 28 and the underside 29 opposite the transport direction 9. The contact takes place at an angle a which is preferably 70°. The upper 92 and lower air jet 93 are oriented such that they meet in mutually opposing regions of the top side 28 firstly and the underside 29 secondly.

The first exemplary embodiment of the method may be carried out advantageously with the drying device 1 or the drying device 70.

A refinement of the method depicted diagrammatically in FIG. 13 is explained below with reference back to FIG. 4. In this refinement, the upper 92 and lower air jet 93 flow onto a rear edge 6 of the semiconductor substrate in flow directions which are oriented obliquely, such that the rear edge 6 encloses an angle c of 3° with the inflow direction of the upper air jet 92 and also with the inflow direction of the lower air jet 93. The angle c is directly linked to the angle b depicted in FIG. 4. For this, c=90°−b.

Figure 14:
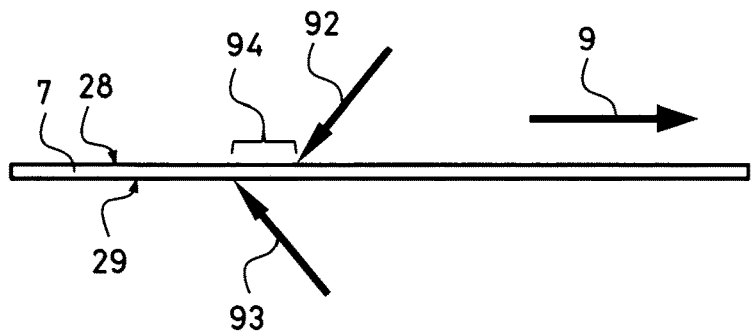
FIG. 14 a principle depiction of a second exemplary embodiment of the method.

FIG. 14 illustrates a second exemplary embodiment of the method. Here, the upper air jet 92 and the lower air jet 93 are oriented such that they make contact with the semiconductor substrate 7 offset to each other by an offset 94 in the transport direction. The offset 94 preferably amounts to 2 mm. The upper air jet 92 makes contact with the semiconductor substrate 7 offset downstream in the transport direction 9 relative to the lower air jet 93. This has proved successful in practice.

The exemplary embodiment of the method illustrated in FIG. 14 may be implemented with the drying device 40.

Figure 15:
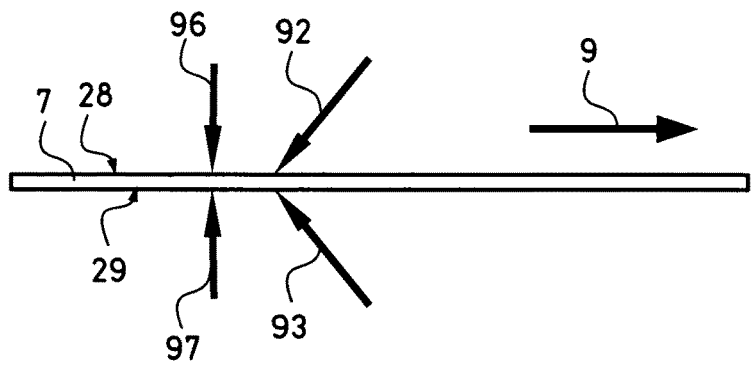
FIG. 15 third exemplary embodiment of the method.

A further exemplary embodiment of the method is illustrated in FIG. 15. Here, an upper stabilizing air jet 96 flows onto the top side 28 of the semiconductor substrate, and a lower stabilizing air jet 97 flows onto the underside 29. As shown in FIG. 15, the flow directions of the upper stabilizing air jet 96 and lower stabilizing air jet 97 are oriented in opposite directions. Also, the flow directions of the two stabilizing air jets 96, 97 run parallel to a surface normal of the transport plane 8. The stabilizing air jets 96, 97 may again be used additionally or alternatively to reduce or avoid vibrations of the semiconductor substrate.

Figure 16:
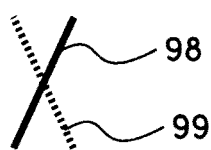
FIG. 16 contrary jet profiles.

FIG. 16 shows in a diagrammatic depiction a jet profile 98 of the upper stabilizing air jet 96 from FIG. 15, and a jet profile 99 of the lower stabilizing air jet 97 from FIG. 15. As can be seen in FIG. 16, these jet profiles 98, 99 are contrary.

The exemplary embodiment of FIGS. 15 and 16 may be implemented by means of the drying device 70.

Although the invention has been illustrated and described in detail with reference to preferred exemplary embodiments, the invention is not restricted by the exemplary embodiments disclosed, and other variants of the invention may be derived by the person skilled in the art without deviating from the basic concept of the invention.

The following is a summary list of reference numerals and the corresponding structure used in the above description of the invention.

LIST OF REFERENCE SIGNS

1 Drying device
2a, 2b Upper drying head
3a, 3b Lower drying head
4a, 4b Air outlet slot
5a, 4b Air outlet slot
6 Rear edge
7 Semiconductor substrate
8 Transport plane
9 Transport direction
11 Slot plane
13 Slot depth
14 Slot width
15 Slot length
16 Reinforcing web
18a, 18b Base plate
19a, 19b Base plate
20 Cover
22 Pocket
23 Cavity
24 Angled plate
25 Hole bore
26 Upper pipe supply line
27 Lower pipe supply line
28 Top side
29 Underside
40 Drying device
42a, 42b Upper drying head
43a, 43b Lower drying head
45a, 45b Air outlet slot
48a, 48b Base plate
49a, 49b Base plate
51a, 51b Hose supply line
51c, 51d Hose supply line
54 Angled plate
70 Drying device
72a, 72b Upper drying head
73a, 73b Lower drying head
74a Air outlet slot
75a Air outlet slot
78a Base plate
79a Base plate
80a Stabilizing slot
81a Stabilizing slot
82 Pocket
84 Cut-out
85 Web
92 Upper air jet
93 Lower air jet
94 Offset
96 Upper stabilizing air jet
97 Lower stabilizing air jet
98 Jet profile of upper stabilizing air jet
99 Jet profile of lower stabilizing air jet
a Angle
b Angle
c Angle
C-C Section line
Z Partial region

The invention claimed is:

1. A drying device, comprising:
drying heads including at least one upper drying head and at least one lower drying head, wherein said at least one upper drying head is disposed above a transport plane, in which objects to be dried can be transported in a transport direction through the drying device, and said at least one lower drying head is disposed below the transport plane;
said at least one upper drying head and said at least one lower drying head having air outlet slots formed therein with each having at least one air outlet slot of said air outlet slots, longitudinal directions of said air outlet slots extend substantially parallel to the transport plane and transversely to the transport direction, and wherein slot planes, in which said air outlet slots run, intersect the transport plane at angles which are greater than 0° and less than 90°, wherein the longitudinal direction of at least one of said air outlet slots extends substantially perpendicularly to the transport direction;
said upper drying head and said lower drying head, forming a drying head pair, disposed above each other such that the slot planes, in which said air outlet slots of said upper drying head of said drying head pair run, form first intersection lines with the transport plane which run parallel to second intersection lines formed with the transport plane by the slot planes in which said air outlet slots of said lower drying head of said drying head pair run; and the first intersection lines are offset in the transport direction relative to the second intersection lines by a value between 1 mm and 5 mm.

2. The drying device according to claim 1, wherein said air outlet slots have a substantially uniform slot depth which assumes a value between 1 mm and 5 mm.

3. The drying device according to claim 1, wherein said air outlet slots have a slot width which is greater than or equal to 0.3 mm and less than or equal to 0.7 mm.

4. The drying device according to claim 1, further comprising stiffening webs for stabilizing forms of said air outlet slots.

5. The drying device according to claim 1, wherein at least one of said drying heads has:
- a base plate in which a pocket for air guidance is machined; and
- a cover connected to said base plate and by means of which said pocket can be closed so as to form a cavity.

6. The drying device according to claim 1, further comprising an angled plate for stiffening at least one of said drying heads.

7. The drying device according to claim 1, wherein the longitudinal directions of all of said air outlet slots extend substantially perpendicularly to the transport direction.

8. The drying device according to claim 1, wherein said upper drying head and said lower drying head form a drying head pair, said drying head pair is one of at least two drying head pairs which are disposed next to each other in the transport direction.

9. A method for drying a sheet-shaped substrate in a continuous system, which comprises steps of:
- providing an upper air jet extending over an entire width of the sheet-shaped substrate and flowing onto a top side of the sheet-shaped substrate;
- providing, at a same time, a lower air jet extending over the entire width of the sheet-shaped substrate and flowing onto an underside of the sheet-shaped substrate, the upper air jet and lower air jet flow onto the top side and the underside respectively of the sheet-shaped substrate at angles, relative to a transport plane in which the sheet-shaped substrate is transported, which are greater than 0° and less than 90°; and
- orienting the upper air jet and the lower air jet such that they make contact with the sheet-shaped substrate offset to each other in a transport direction by a value between 1 mm and 5 mm.

10. The method according to claim 9, wherein the upper air jet and the lower air jet flow onto the top side and the underside respectively of the sheet-shaped substrate at angles, relative to the transport plane, which are greater than 60° and less than 80°.

\* \* \* \* \*